United States Patent [19]

Keller

[11] Patent Number: 5,346,586

[45] Date of Patent: Sep. 13, 1994

[54] METHOD FOR SELECTIVELY ETCHING POLYSILICON TO GATE OXIDE USING AN INSITU OZONE PHOTORESIST STRIP

[75] Inventor: David J. Keller, Boise, Id.

[73] Assignee: Micron Semiconductor, Inc., Boise, Id.

[21] Appl. No.: 996,074

[22] Filed: Dec. 23, 1992

[51] Int. Cl.$^5$ .......................................... H01L 21/00
[52] U.S. Cl. ................................. 156/656; 156/643; 156/646; 156/662; 156/657; 156/661.1; 156/653
[58] Field of Search .............. 156/643, 646, 652, 653, 156/656, 657, 659.1, 661.1

[56] References Cited

U.S. PATENT DOCUMENTS

| | | | |
|---|---|---|---|
| 4,341,592 | 7/1982 | Shortes et al. | 156/643 |
| 4,885,047 | 12/1989 | Ury et al. | 156/345 |
| 4,904,338 | 2/1990 | Kozicki | 156/659.1 |
| 5,071,485 | 12/1991 | Matthews et al. | 134/2 |
| 5,094,712 | 3/1992 | Becker et al. | 156/646 |
| 5,169,487 | 12/1992 | Langley et al. | 156/646 |
| 5,201,993 | 4/1993 | Langley | 156/657 |

FOREIGN PATENT DOCUMENTS 59-121843 7/1984 Japan .
02304921 12/1990 Japan .

OTHER PUBLICATIONS

"Very High Sective n/supt/poly-Si Rie with Carbon Elimination"; J. Appl Phys. 2, Lett; Nakamura et. al.; vol. 28; No. 10; 1989.

*Primary Examiner*—R. Bruce Breneman
*Assistant Examiner*—George Goudreau
*Attorney, Agent, or Firm*—Stephen A. Gratton

[57] ABSTRACT

In semiconductor manufacture, a method of etching a polysilicon layer to a gate oxide in a semiconductor structure is provided. The method is performed insitu in a plasma etch chamber. Initially, an oxide hard mask is formed on the semiconductor structure by etching a deposited oxide layer through a photoresist mask. The photoresist mask is then stripped in the same etch chamber using a high pressure ozone plasma. With the photoresist mask stripped from the semiconductor structure, the polysilicon layer can be etched through the oxide hard mask to the gate oxide with a high etch selectivity.

16 Claims, 2 Drawing Sheets

METHOD FOR SELECTIVELY ETCHING POLYSILICON TO GATE OXIDE USING AN INSITU OZONE PHOTORESIST STRIP

FIELD OF THE INVENTION

This invention relates to semiconductor manufacture and more particularly to a novel method for selectively etching a polysilicon layer to the gate oxide layer of a semiconductor structure.

BACKGROUND OF THE INVENTION

Semiconductor manufacturing technology has advanced to the point where a single die may contain millions of active devices. A key requirement for fabricating such high density circuits is the elimination of contaminants from the manufacturing process. This has led to the development of ultra high vacuum processing and closed manufacturing systems. Such closed systems preferably include insitu process sequences that can be precisely controlled without exposure of the wafer to the ambient.

One area of semiconductor manufacture in which the elimination of contaminants and the precise control of process sequences is important is in the etching techniques for etching different film layers formed on the wafer. In general, integrated circuits are formed by patterning regions on a semiconducting substrate and then by patterning different film layers formed on the substrate. As an example, during manufacture, a silicon substrate is typically formed with an oxide layer, such as silicon dioxide. This oxide layer may function as a gate oxide to the active devices formed on the substrate. In addition this oxide layer may function as the dielectric layer for capacitors formed on the substrate.

Other film layers may be formed or deposited on the gate oxide. As an example, polysilicon may be deposited on the gate oxide layer as a surface conduction layer. Other films in turn, may be deposited on the polysilicon layer. These various film layers must be patterned and etched to the gate oxide.

The technique of photolithography is frequently used to pattern and etch these different film layers. Typically this involves coating the wafer with a photoresist. The photoresist is then exposed with ultraviolet radiation passed through a mask. A desired pattern is thus imaged on the photoresist to form a photoresist mask. The photoresist mask includes exposed areas that allow an underlying film to be etched using wet or dry etching processes. The etch depth or endpoint must be closely controlled to insure that an underlying layer (i.e. gate oxide) is not also etched through. For etching the small feature sizes required for high density applications, dry etch processes are typically utilized. With dry etching, gases are the primary etch medium. Plasma dry etching uses plasma energy to drive the reaction.

As the industry moves towards higher density applications, the gate oxides used for the active devices of a semiconductor structure have tended to become thinner. Such thin gate oxides require etching techniques and etchants that are highly selective to the gate oxide. There is then a need in the industry for better methods for patterning and etching the layers of a semiconductor structure, particularly polysilicon which have been formed on a thin gate oxide.

It is known in the industry that in a plasma dry etch process, the etch selectivity to a gate oxide can be more easily achieved when there is no photoresist present during the polysilicon to gate oxide etch step. Accordingly, in a representative prior art process sequence for etching a semiconductor structure that includes a gate oxide, another oxide layer is first deposited over the semiconductor structure. A layer of photoresist in then deposited on the oxide layer. An oxide hard mask is formed to the polysilicon layer by etching the oxide layer through the photoresist mask. For stripping the photoresist, the wafer is transferred to a photoresist strip chamber. With the photoresist removed, the wafer is transferred to a poly etch chamber to etch the polysilicon layer to the gate oxide.

The transfer of the wafer during the different etch steps tends to introduce contaminants during this process. In particular, exposure of the wafers to ambient may introduce contaminants. Additionally, each different process chamber may introduce contaminants. Moreover, process parameters are difficult to control with physical transfer of the wafers between these different process stations. Finally, the operation of these different process stations is time consuming and adds to production costs.

The present invention recognizes that during a plasma dry etch, a photoresist mask may be stripped insitu by using an ozone plasma. The etch selectivity of a polysilicon layer with respect to a gate oxide can thus be increased without exposing the wafer to multiple process stations.

It is known in the art that ozone is effective for removing a layer of photoresist from an underlying surface. As an example, U.S. Pat. Nos. 4,341,592; 4,885,047; and 5,071,485 disclose semiconductor manufacturing processes in which ozone is used to strip photoresist from a silicon substrate. The method of the invention uses this technique to provide an improved method for etching through a polysilicon layer to a gate oxide.

Accordingly, it is an object of the present invention to provide a method for stripping a photoresist layer and etching through a polysilicon layer to a gate oxide. It is a further object of the present invention to provide a method for etching through a polysilicon layer to a gate oxide that can be performed insitu so that contamination can be eliminated. It is another object of the present invention to provide a method of plasma dry etching a polysilicon layer to a gate oxide which is relatively inexpensive and adaptable to large scale semiconductor manufacture.

SUMMARY OF THE INVENTION

In accordance with the present invention, a novel method for plasma dry etching a polysilicon layer to a gate oxide of a semiconductor structure is provided. The method of the invention, broadly stated, includes the steps of: forming a patterned photoresist mask on a semiconductor structure; forming an oxide hard mask in a plasma etch chamber using the photoresist mask; removing the photoresist mask insitu within the etch chamber using an ozone plasma; and then etching through the polysilicon layer of the semiconductor structure to the gate oxide utilizing a suitable gas etchant.

An illustrative semiconductor structure suitable for dry etching in accordance with the invention, includes; a substrate, a gate oxide, and a polysilicon layer. In accordance with the invention, another oxide layer is initially formed on the semiconductor structure above the polysilicon layer. A photoresist mask is then formed on the oxide layer. Using the photoresist mask, the oxide layer is etched to form an oxide hard mask. The photoresist is then removed insitu using an ozone plasma. With the layer of photoresist removed, the polysilicon layer is etched through to the gate oxide utilizing a suitable plasma gas etchant.

By stripping the photoresist layer before the poiysilicon is etched, the etch selectivity of the polysilicon with respect to the gate oxide is increased. The entire etching process is performed insitu in a single wafer plasma etch chamber. This eliminates the exposure of the wafer to ambient and the introduction of contaminants into the process. Moreover, the control of process parameters, such as gas chemistries, pressures, temperatures, flow rates and etching rates is simplified with a single etch chamber. In addition, the ozone plasma used to strip the photoresist helps to eliminate contaminants contained in the etch chamber so that the same etch chamber can be utilized to process additional wafers prior to cleaning.

Other objects, advantages and capabilities of the present invention will become more apparent as the description proceeds.

DETAILED DESCRIPTION OF THE INVENTION

Figure 1A:
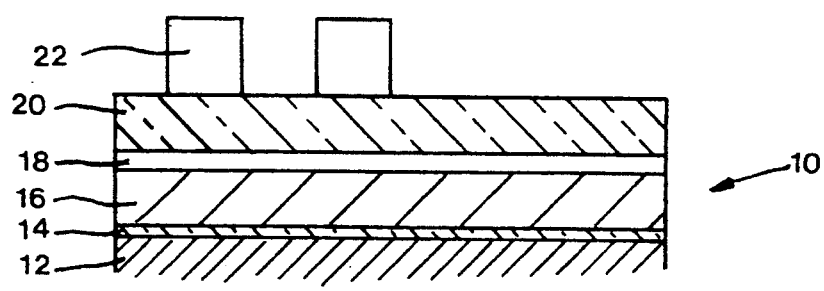
FIGS. 1A–1E are schematic drawings of a semiconductor structure being patterned and etched in accordance with the method of the invention.
Figure 1B:
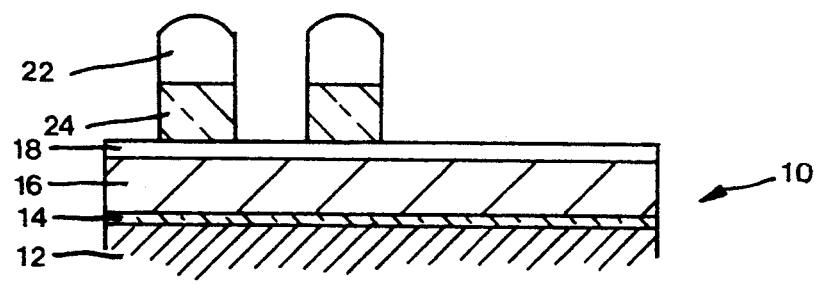

Referring now to FIGS. 1A–1E, a method for patterning and etching a semiconductor structure in accordance with the invention is shown. Initially, and as shown in FIG. 1A, a semiconductor structure 10 includes a silicon substrate 12. Various active semiconductor devices are formed on the substrate 12. As an example, these active devices may include resistors, capacitors, and transistors (not shown).

During manufacture, a gate oxide 14 is formed on the substrate 12. The gate oxide 14 is typically a thin layer (i.e., 100 Å) of silicon dioxide which is thermally grown on the silicon substrate 12 in the gate regions of the transistors. In general, the gate oxide 14 functions as a dielectric whose thickness is chosen specifically to allow induction of a charge in the gate region. Within an MOS transistor, the gate is the part that controls operation of the device. Such a thermally grown gate oxide 14 may also be used as the dielectric layer in capacitors formed between the silicon substrate 12 and a surface conduction layer.

The semiconductor structure 10 also includes a polysilicon layer 16. The polysilicon layer 16 is a relatively thick (i.e., 4000 Å) poly-crystalline layer of silicon that is deposited on the gate oxide 14 using a suitable deposition processes. In silicon gate MOS devices, the polysilicon layer 16 may be used as the silicon gate contact. The polysilicon layer 16 may also be used for interconnections between devices.

In patterning and etching the polysilicon layer 16 to form electrical contact with the various devices, it is important that as the polysilicon layer 16 is etched, the underlying gate oxide 14 remains intact. The etch selectivity of the polysilicon layer 16 relative to the gate oxide layer 14 is therefore preferably high. In general, the etch selectivity is defined as the ratio of the etch rates for the adjacent films (i.e., etch rate poly/etch rate gate oxide). If the etch rate of the polysilicon layer 16 during an etching process is greater than the etch rate of the gate oxide 14, then the end point of the etch process can be controlled without affecting the underlying gate oxide 14. Stated differently, with a high etch selectivity, a plasma dry etch process can be stopped at the endpoint of the polysilicon layer 16 without etching the gate oxide 14.

The particular semiconductor structure 10 illustrated in FIG. 1A, also includes another conductive layer, comprising a tungsten silicide layer 18 (i.e., 1200 Å) deposited on the polysilicon layer 16. The tungsten silicide layer 18 may be used as an interconnect to connect the polysilicon layer 16 to other devices. In place of tungsten silicide ($WSi_x$), other conductive materials may be utilized. An oxide layer 20 (i.e., 3250 Å) is deposited on the tungsten silicide layer 18 to complete the semiconductor structure 10.

After the oxide layer 20 has been formed, the semiconductor structure 10 shown in FIG. 1A, is ready to be patterned and etched in accordance with the method of the invention. As a first step, photoresist 22 is coated on the oxide layer 20 and patterned using photolithographic techniques that are known in the art. For patterning the photoresist 22, ultraviolet radiation may be passed through a mask so that a desired pattern is imaged on the photoresist 22. This causes changes in the solubility of the exposed areas of the photoresist 22, such that after development in a suitable solvent, the desired pattern is fixed on the wafer. The photoresist may then be hard baked to enable it to withstand subsequent processing. This forms a patterned photoresist mask.

Figure 2:
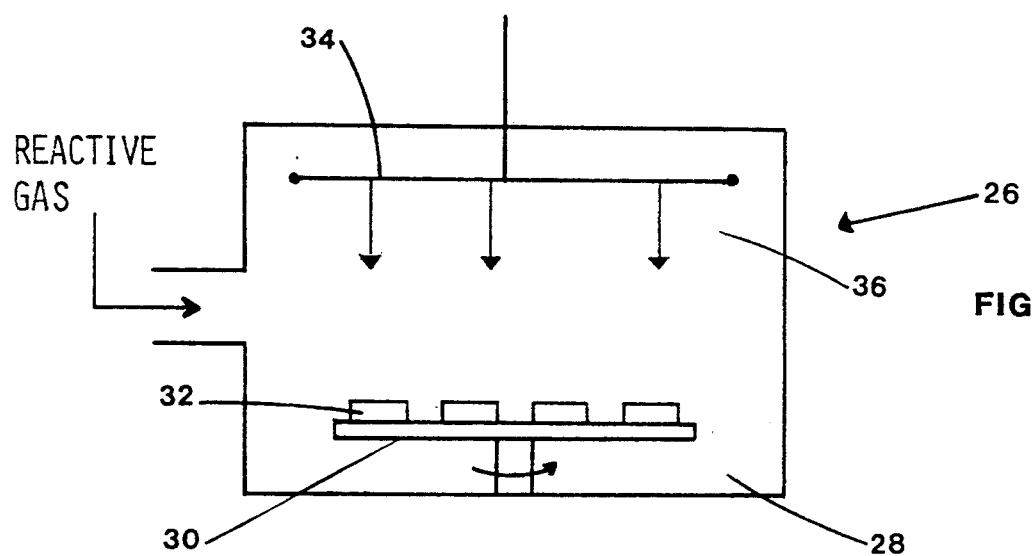
FIG. 2 is a schematic diagram of a plasma etching system for etching a semiconductor structure in accordance with the method of the invention.

With the patterned photoresist mask formed, the semiconductor structure 10 can be etched. The etching process is preferably carried out in a conventional plasma etching system. A typical plasma etching system or reactive ion etcher (RIE) is shown in FIG. 2 and is generally designated as 26. Such a plasma etching system 26 includes an etch chamber 28 in flow communication with a source of reactive gases. The wafers 32 are supported inside the etch chamber 28 on a grounded pallet 30. An RF electrode 34 is connected to a power supply for exciting the reactive gases to form a plasma field 36.

With such a plasma etching system 26, the wafers 32 are located in the plasma field 36 which is directed at the wafer surface. The plasma field 36 contains the gas etchants that react with the different materials of the semiconductor structure to etch through to the gate oxide 14. The chemistry of the gas etchants can be selected to react with the particular layer being etched. In addition, with such a plasma etching system, the etch rate can be controlled by controlling the temperature, pressure, and power of the etching system 26. Endpoint detection can be accomplished by techniques that are known in the art, such as with optical or chemical endpoint detection.

Referring back again to FIG. 1B, initially the oxide layer 20 is etched through the photoresist mask to form an oxide hard mask 24. A suitable gas etchant chemistry for etching the oxide layer 20 includes $CF_4$ and $CHF_3$ gases. Other gas etchants containing, for example, other fluorocarbons (i.e. $C_2F_6$) and other species of chlorine, and fluorine gases may also be used in this application.

Figure 1C:
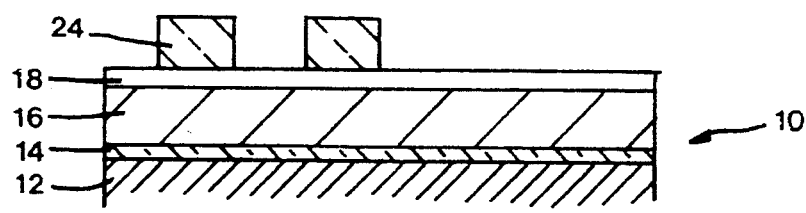

Next, and as shown in FIG. 1C, the photoresist 22 is stripped using an ozone ($O_3$) plasma. The ozone plasma is preferably directed at the wafers 32 using a relatively high pressure and high power.

Figure 1D:
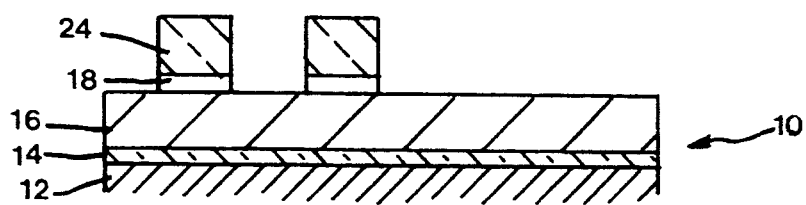

Next, and as shown in FIG. 1D, the tungsten silicide layer 18 is etched using a gas etchant chemistry that may include $SF_6$, He and $O_2$ gases. Etching of the tungsten silicide layer 18 may be followed by an oxide cleanup step.

Figure 1E:
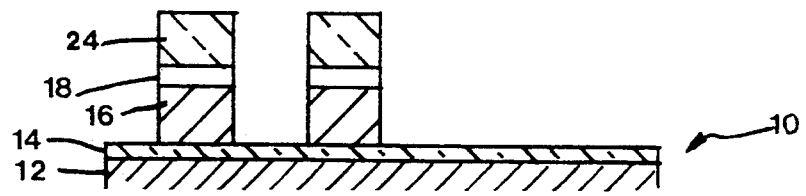

Next, and as shown in FIG. 1E, the polysilicon layer 10 can be etched using a gas etchant chemistry that includes HBr and $Cl_2$ gases. Other gas etchant chemistries including chlorine, bromine or fluorine gas species could also be utilized. All of the etching steps are performed in the same gas chamber 28, with no wafer 32 transfer. There is thus no exposure of the wafers 32 to ambient or to the contaminants present in a separate strip chamber or a wet photoresist solvent.

Because the photoresist 22 was removed prior to the etching of the polysilicon layer 16, the etch will be highly selective to the gate oxide 14. In addition, because the process is performed in a single etch chamber 28, process parameters (i.e., etch chemistry, pressure, temperature, gas flow rates) can be tightly controlled. Moreover, with a single etch chamber 28, there is less wafer handling, greater throughput, and cheaper per wafer costs.

In addition, because the etch chamber 28 is subjected to an ozone clean every time a wafer is processed, the etch chamber 28 will stay cleaner longer. This enables many more wafers to be processed between wet cleans. This also saves time and money because wet cleans are time and labor intensive.

EXAMPLE

Testing was performed on a wafer stack that included 3750 Å oxide, on 1200 Å $WSi_x$, on 4000 Å poly, on 150 Å gate oxide. It was determined that greater selectivity (poly to gate) oxide can be achieved if the poly etch is done in the absence of photoresist. In addition, it was determined that when poly is etched in the absence of a photoresist, the etch rate increased by a factor 1.5.

The following tests were performed to prove enhanced poly to gate oxide selectivity in the absence of photoresist.

First two wafers constructed as described above were etched insitu in an AME 5000 MERIE plasma dry etch system. Such an etch system is high density and provides an etch chamber that is low pressure. Other low pressure high density etchers manufactured under the tradenames of, for example, ECR, TCP, Merle and Triode could also be utilized.

The first wafer was a control wafer. This wafer received a standard etch process as follows:

| Å oxide | $CF_4$, $CHF_3$ |
|---|---|
| Å $WSi_x$ | $SF_6$, He, $O_2$ |
| Oxide clean up | $CF_4$, $CHF_3$ |
| Å poly | HBr, $Cl_2$ |
| Poly over etch | HBr, $Cl_2$, He, $O_2$ |

The second wafer was the experimental wafer. This wafer received the first part of the above noted process in which 3750 Å of oxide and 1200 Å of $WSi_x$ were etched. The wafer was then treated with an ozone plasma to strip the photoresist. The wafer then received the standard poly etch to remove the remaining poly. Hence, one wafer had its poly etched in the presence of photoresist (the control wafer) and the other wafer had its poly etched in the absence of photoresist (the experimental wafer).

Optical endpoint detection was used to determine the amount of time for the poly to clear. With this data the etch rate of poly for both wafers was calculated.

From previous development, it is known that using a standard etch process, about 3500 Å of poly are left after the oxide and $WSi_x$ etch.

The control wafer cleared in 72 seconds.

The experimental wafer cleared in 46 seconds.

Therefore, the etch rate for the control wafer was Å/72 seconds=49 Å/second or 2917 Å/min.

The etch rate for the experimental wafer was Å/46 seconds=76 Å/second or 4565 Å/min.

Hence, the etch rate of the experimental wafer increased by a factor 1.5.

Then the remaining gate oxide left over after the etch was measured on both the control wafer and the experimental wafer. The wafers were then placed back in the plasma etcher and etched for a fixed time using the poly etch process. This was done to determine the etch rate of the gate oxide during etching so that the selectivity of poly to gate oxide could be determined.

| Before | After | Delta | Etch Time | 10 seconds |
|---|---|---|---|---|
| CONTROL WAFER GATE OXIDE MEASUREMENTS | | | | |
| Flat | 85 | 27 | 58 | Etch Rate 323 Å/min |
| Center | 95 | 48 | 47 | |
| Bottom | 107 | 51 | 56 | |
| Left | 69 | 12 | 57 | |
| Right | 62 | 11 | 51 | |
| EXPERIMENTAL WAFER GATE OXIDE MEASUREMENT | | | | |
| Flat | 131 | 101 | 30 | Etch Rate 164 Å/min |
| Center | 148 | 119 | 29 | |
| Bottom | 145 | 108 | 37 | |
| Left | 128 | 111 | 17 | |
| Right | 126 | 102 | 24 | |

With this data, selectivity of poly to gate oxide was calculated for both the control wafer and the experimental wafer.

Control Wafer

Etch rate of poly=2917 Å/min.

Etch rate of gate oxide 323 Å/min.

Selectivity polygate oxide=2917 Å/min: 323 Å/min=9:1

Experimental Wafer

Etch rate of poly=4565 Å/min.

Etch rate of gate oxide 164 Å/min.

Selectivity of polygate oxide=4565 Å/min:164 Å/min=28:1

Hence, the selectivity of poly to gate increased by a factor of 3 when poly is etched in the absence of photoresist.

This data shows that etching poly in the absence of photoresist gives very desirable results, namely the poly etch rate increases by a factor of 1.5 and the selectivity of poly to gate oxide increases by a factor of 3.

Thus the invention provides a simple, yet unobvious method for etching a polysilicon layer to a gate oxide. The entire etching process is performed insitu using an ozone plasma to strip a layer of photoresist. Although the invention has been described in terms of a preferred embodiment, it is intended that alternate embodiments of the inventive concepts expressed herein be contained within the scope of the following claims.

What is claimed is:

1. In semiconductor manufacture, a method for etching a silicide layer and a polysilicon layer to a gate oxide layer formed on a substrate, comprising:
   forming an oxide layer on the silicide layer;
   forming a patterned photoresist mask on the oxide layer;
   forming an oxide hard mask by etching the oxide layer through the photoresist mask in an etch chamber of a reactive ion etcher (RIE) using a first gas etchant;
   removing the photoresist mask insitu in the etch chamber using an ozone plasma;
   etching the silicide layer insitu in the etch chamber using the oxide hard mask and a second gas etchant; and
   etching the polysilicon layer insitu in the etch chamber using the oxide mask and a third gas etchant.

2. The method as claimed in claim 1 and wherein the first gas etchant includes a species of gas selected from the group of gas species consisting of fluorocarbon, chlorine or fluorine species.

3. The method as claimed in claim 1 and wherein the silicide layer is formed of tungsten silicide.

4. The method as claimed in claim 1 and wherein the third gas etchant includes a species selected from the group of species consisting of a fluorine, bromine, or chlorine species.

5. The method as claimed in claim 1 and wherein the second gas etchant includes $SF_6$, $O_2$ and He.

6. In a semiconductor structure including a substrate, a gate oxide layer formed on the substrate, a polysilicon layer formed on the gate oxide, and a silicide layer formed on the polysilicon layer, a method of etching the silicide and polysilicon layers, comprising:
   forming an oxide layer on the silicide layer;
   forming a photoresist mask on the oxide layer;
   etching the oxide layer through the photoresist mask in an etch chamber of a reactive ion etcher (RIE) using a first gas etchant to form an oxide hard mask;
   stripping the photoresist mask insitu in the etch chamber using an ozone plasma;
   etching the silicide layer insitu in the etch chamber using a second gas etchant; and
   etching the polysilicon layer insitu in the etch chamber using a third gas etchant.

7. The method as recited in claim 6 and wherein the first gas etchant is a fluorocarbon gas.

8. The method as recited in claim 7 and wherein the first gas etchant includes $CF_4$ and $CHF_3$.

9. The method as recited in claim 6 and wherein the silicide layer is tungsten silicide.

10. The method as recited in claim 6 and wherein the second gas etchant includes $SF_6$ and He.

11. The method as recited in claim 6 and wherein the third gas etchant includes Hbr and $Cl_2$.

12. In a semiconductor structure including a silicon substrate, a gate oxide, a polysilicon layer and a silicide layer, a method for etching the polysilicon layer to the gate oxide, comprising;
   forming an oxide hard mask by depositing an oxide layer on the silicide layer, forming a photoresist mask on the oxide layer and etching the oxide layer in an etch chamber of a reactive ion etcher (RIE) using a first etching gas;
   stripping the photoresist mask insitu in the etch chamber using an ozone plasma;
   etching the silicide layer in the etch chamber using the oxide hard mask and a second etch gas; and
   etching the polysilicon layer to the gate oxide in the etch chamber using the oxide hard mask and a third etch gas.

13. The method as recited in claim 12 and wherein the second etch gas contains a gas species selected from the group of species consisting of a fluorine, chlorine or bromine gas species.

14. The method as recited in claim 12 and wherein the third etch gas contains HBr and $Cl_2$.

15. The method as recited in claim 12 and wherein the first etch gas contains a fluorocarbon gas species.

16. The method as recited in claim 12 and wherein the etch selectivity of the polysilicon to the gate oxide is about twenty eight to one.

* * * * *